United States Patent
Forest et al.

(10) Patent No.: US 11,641,217 B2
(45) Date of Patent: May 2, 2023

(54) METHOD AND DEVICE FOR DETECTING THE PHASE OF A SIGNAL VIA A HYBRID COUPLER, USING A TEST SIGNAL

(71) Applicants: STMICROELECTRONICS SA, Montrouge (FR); INSTITUT POLYTECHNIQUE DE BORDEAUX, Talence (FR); CENTRE NATIONAL DE LA RECHERCHE SCIENTIFIQUE, Paris (FR); UNIVERSITE DE BORDEAUX, Bordeaux (FR)

(72) Inventors: Jeremie Forest, Villard Bonnot (FR); Vincent Knopik, Crets en Belledonne (FR); Eric Kerherve, Pessac (FR)

(73) Assignees: STMICROELECTRONICS SA, Montrouge (FR); CENTRE NATIONAL DE LA RECHERCHE SCIENTIFIQUE, Paris (FR); INSTITUT POLYTECHNIQUE DE BORDEAUX, Talence (FR); UNIVERSITE DE BORDEAUX, Bordeaux (FR)

( * ) Notice: Subject to any disclaimer, the term of this patent is extended or adjusted under 35 U.S.C. 154(b) by 113 days.

(21) Appl. No.: 17/421,589

(22) PCT Filed: Jan. 22, 2019

(86) PCT No.: PCT/FR2019/050138
§ 371 (c)(1),
(2) Date: Jul. 8, 2021

(87) PCT Pub. No.: WO2020/152401
PCT Pub. Date: Jul. 30, 2020

(65) Prior Publication Data
US 2022/0158675 A1 May 19, 2022

(51) Int. Cl.
*H04B 1/18* (2006.01)
*H04B 1/04* (2006.01)
*H03F 3/24* (2006.01)

(52) U.S. Cl.
CPC ............. *H04B 1/18* (2013.01); *H03F 3/24* (2013.01); *H04B 1/04* (2013.01); *H03F 2200/451* (2013.01)

(58) Field of Classification Search
None
See application file for complete search history.

(56) References Cited

U.S. PATENT DOCUMENTS 7,088,173 B1 * 8/2006 Rozario ............... H03F 3/602
330/124 R
8,442,099 B1 * 5/2013 Sederat ................ H04B 3/32
375/220

(Continued)

FOREIGN PATENT DOCUMENTS

JP 05251965 A 9/1993
WO WO-2017201534 A1 * 11/2017 ............ H01P 5/18

OTHER PUBLICATIONS

Ohm, Gerhard et al., "Microwave Phase Detectors for PSK Demodulators", IEEE Transactions on Microwave Theory and Techniques, vol. MTT-29, No. 7, Jul. 7, 1981, 8 pages.

*Primary Examiner* — Pablo N Tran
(74) *Attorney, Agent, or Firm* — Slater Matsil, LLP (57) ABSTRACT

In an embodiment method, a hybrid coupler comprises a first input receiving an analog signal, a second input receiving an additional analog signal phase shifted by 90° from the analog signal, and first and second outputs. The method comprises injecting into the second output a test signal having an initial test phase, iteratively generating a current test phase for the test signal, from the initial test phase to a final test phase equal to the initial test phase increased by at (Continued)

least one portion of one complete revolution, and, in each iteration, measuring the current peak value of the first output, and storing the current test phase and the current peak value as a maximum/minimum peak value if there is not a stored maximum/minimum peak value higher/lower than the current peak value, respectively, and determining a phase of the analog signal from the stored test phase.

22 Claims, 5 Drawing Sheets

(56) References Cited

U.S. PATENT DOCUMENTS

| | | | |
|---|---|---|---|
| 9,912,375 B1* | 3/2018 | Sedarat | H01F 19/04 |
| 2004/0127178 A1* | 7/2004 | Kuffner | H01P 1/20 |
| | | | 455/133 |
| 2005/0156585 A1* | 7/2005 | Niedzwiecki | H04B 3/493 |
| | | | 324/76.21 |
| 2009/0103673 A1 | 4/2009 | Lin et al. | |
| 2012/0126821 A1* | 5/2012 | Forstner | G01R 31/2822 |
| | | | 455/226.2 |
| 2014/0341564 A1* | 11/2014 | Westlund | H04B 10/0731 |
| | | | 398/16 |

* cited by examiner

METHOD AND DEVICE FOR DETECTING THE PHASE OF A SIGNAL VIA A HYBRID COUPLER, USING A TEST SIGNAL

CROSS-REFERENCE TO RELATED APPLICATIONS

This application is a national phase filing under section 371 of PCT/FR2019/050138, filed on Jan. 22, 2019, which is hereby incorporated herein by reference in its entirety.

TECHNICAL FIELD

Implementations and embodiments of the invention relate to electronic devices, and more particularly to phase-detecting electronic devices.

BACKGROUND

Generally, the objective of a phase-detecting electronic device, or in other words a phase detector, is to generate an output signal proportional to the phase difference between two input signals.

SUMMARY

A conventional phase-detecting electronic device generally comprises either analog components such as analog multipliers, or digital circuits such as logic gates or flip-flops.

However, such an electronic device is not suitably designed for electromagnetic applications in the radio-frequency (RF) domain and in particular in the millimeter-band domain.

There is thus a need to provide a technical solution of low complexity that will allow the phase of an analog signal to be detected for very high frequency electromagnetic applications without making substantial modifications to the electronic circuits used in such applications.

According to one aspect, a method for detecting the phase of an analog signal via a hybrid coupler operating in a power combiner mode is proposed.

The hybrid coupler comprises a first input intended to receive the analog signal, a second input intended to receive an additional analog signal that is phase shifted by 90° with respect to the analog signal, a first output that delivers an output signal, and a second output, the method comprising injecting into the second output a test signal having an initial test phase, iteratively generating a current test phase for the test signal, from the initial test phase to a final test phase equal to the initial test phase increased by at least one portion of one complete revolution, and, in each iteration, measuring the current peak value of the output signal, and storing in memory the current test phase and the current peak value as maximum peak value or minimum peak value if there is not a stored maximum peak value higher or a stored minimum peak value lower than the current peak value, respectively, and determining the phase of the analog signal depending on the stored test phase.

Advantageously, such a method based on the use of a hybrid coupler is intrinsically suitable for very high frequency electromagnetic applications.

Furthermore, for transmission paths in particular already comprising hybrid couplers, for example balanced power amplifiers, such a method advantageously enables a non-invasive technical solution of low complexity.

By virtue of the intrinsic characteristics of the hybrid coupler, when the hybrid coupler, operating in the power-combiner mode, receives at its first and second inputs the analog signal and the additional analog signal that is phase shifted by 90° with respect to the analog signal, respectively, an output signal having a power equal to the combination of the powers of the analog signal and of the additional analog signal, in other words to two times the power of the analog signal, is obtained at one of the first and second outputs if the other of the first and second outputs is coupled to a resistive impedance, for example of 50 ohms.

If the other of the first and second outputs is intended to receive another analog signal, here for example a test signal, instead of the impedance of 50 ohms, the amplitude of the output signal varies depending on the phase of the test signal.

When the phase of the test signal is equal to the phase of the test signal, the amplitude of the output signal reaches its maximum value.

In other words, when the peak value of the output signal reaches its maximum value, the phase of the test signal corresponding to this maximum peak value is substantially equal to the phase of the analog signal.

In contrast, when the phase of the test signal is substantially equal to the phase of the analog signal decreased by 180°, the corresponding peak value of the output signal reaches its minimum value.

Thus, according to one implementation, the phase of the analog signal is equal to the stored test phase if the stored test phase corresponds to the stored maximum peak value, or to the stored test phase increased by 180° if the stored test phase corresponds to the stored minimum peak value.

By way of nonlimiting indication, the final test phase may be the initial test phase increased by one complete revolution.

According to another aspect, a method for adjusting the phase of an analog signal via a hybrid coupler operating in a power-combiner mode is proposed.

This adjusting method comprises determining the phase of the analog signal by applying the method as defined above, comparing a setpoint phase and the phase of the analog signal, and if the setpoint phase and the phase of the analog signal are different, adjusting the phase of the analog signal until an equality is obtained between the setpoint phase and the phase of the analog signal to within a tolerance.

It should be noted that a person skilled in the art will be able to choose a suitable tolerance depending for example on the envisioned application. By way of nonlimiting indication, the tolerance may for example be about 5 to 10%.

According to another aspect, an electronic device for detecting the phase of an analog signal is proposed.

This device comprises a hybrid coupler configured to operate in a power-combiner mode and comprising a first input intended to receive the analog signal, a second input intended to receive an analog signal that is phase shifted by 90° with respect to the analog signal, a first output intended to deliver an output signal, and a second output, a detecting circuit configured to inject into the second output a test signal having an initial test phase, iteratively generate a current test phase for the test signal, from the initial test phase to a final test phase equal to the initial test phase to a final test phase equal to the initial test phase increased by at least one portion of one complete revolution, and, in each iteration, measure the current peak value of the output signal, and store in memory the current test phase and the current peak value as maximum peak value or minimum peak value if there is not a stored maximum peak value higher or a stored minimum peak value lower than the current peak value, respectively, and determine the phase of the analog signal depending on the stored test phase.

According to one embodiment, the phase of the analog signal is equal to the stored test phase if the stored test phase corresponds to the stored maximum peak value or to the stored test phase increased by 180° if the stored test phase corresponds to the stored minimum peak value.

According to another embodiment, the final test phase is the initial test phase increased by one complete revolution.

According to another aspect, a device is proposed for adjusting the phase of an analog signal via a hybrid coupler configured to operate in a power-combiner mode, comprising a device for detecting the phase of the analog signal as defined above configured to determine the phase of the analog signal, and an adjusting circuit coupled to the hybrid coupler, and configured to deliver to the first input the analog signal, to the second input the additional analog signal, and to the detecting circuit a setpoint signal having a setpoint phase, the detecting circuit furthermore being configured to compare the setpoint phase and the determined phase of the analog signal, and if the setpoint phase and the determined phase of the analog signal are different, adjust the phase of the analog signal via the adjusting circuit until an equality is obtained between the setpoint phase and the phase of the determined analog signal to within a tolerance.

According to one embodiment, the adjusting circuit comprises a complementary hybrid coupler configured to operate in a power-divider mode and coupled to the first and second inputs of the hybrid coupler.

According to another embodiment, the adjusting means comprises a complementary hybrid coupler configured to operate in a power-divider mode and coupled to the first and second inputs of the hybrid coupler via a coupling stage.

According to another aspect, a transmission path comprising a detecting electronic device as defined above or an adjusting electronic device as defined above, and an antenna coupled to the hybrid coupler, is proposed.

According to yet another aspect, a communication apparatus incorporating at least one transmission path as defined above is proposed.

BRIEF DESCRIPTION OF THE DRAWINGS

Other advantages and features of the invention will become apparent on examining the detailed description of completely nonlimiting embodiments and implementations, and the appended drawings in which.

DETAILED DESCRIPTION OF ILLUSTRATIVE EMBODIMENTS

Figure 1:
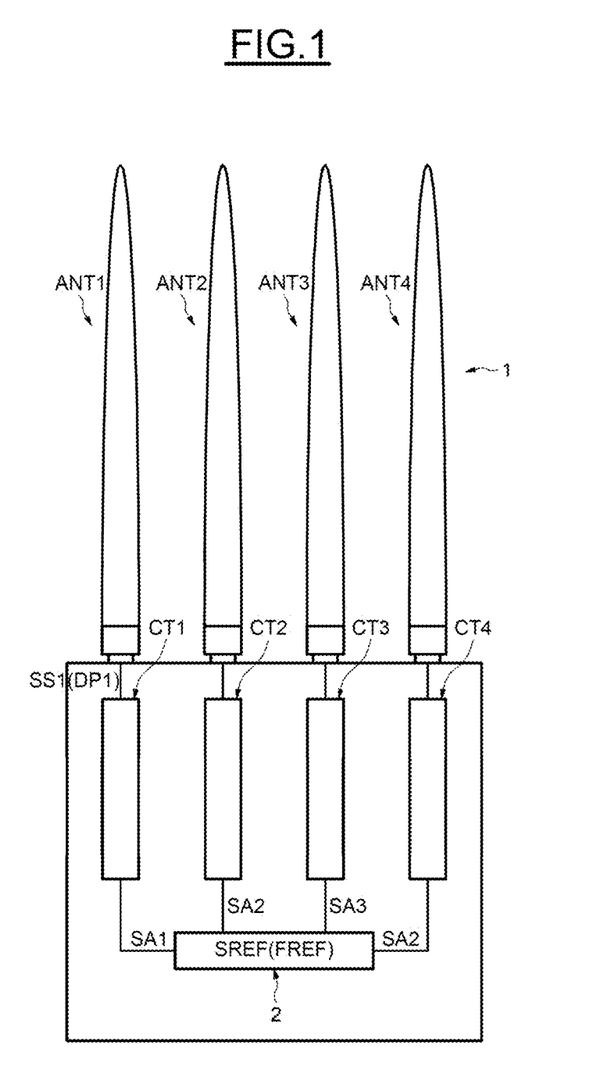
FIG. 1 illustrates a communication apparatus.

FIG. 1 illustrates a communication apparatus 1, here for example a communication apparatus of the Wi-Fi router type according to the standards of the IEEE 802.11 group.

Byway of nonlimiting example, this router 1 here employs beamforming technology, commonly known in the art, to achieve directional emission of signals.

This router 1 comprises an emitting module 2, here for example a transceiver 2 configured to generate N analog signals SA1, SA2, SA3, SA4 (N is an integer equal to or higher than two, here N is for example equal to 4), and N antennas ANT1, ANT2, ANT3, ANT4 coupled to the transceiver 2 via four transmission paths CT1, CT2, CT3, CT4, respectively.

Each analog signal SA1, SA2, SA3, SA4 is generated from a reference signal SREF having a reference frequency FREF and each analog signal SA1, SA2, SA3, SA4 is intended to have a phase shift preset with respect to the reference signal SREF.

In general, the transceiver 2 is configured to control the relative phase and the relative amplitude of each analog signal SA1, SA2, SA3, SA4 dedicated to the corresponding transmission path CT1, CT2, CT3, CT4.

After signal-processing operations carried out by each transmission path CT1, CT2, CT3, CT4, each antenna ANT1, ANT2, ANT3, ANT4 is configured to emit a corresponding output signal SS1, SS2, SS3, SS4 having a corresponding preset phase shift DP1, DP2, DP3, DP4.

As a result, a pattern of constructive and destructive interference may be formed in the wave front. On reception, the information originating from the various antennas ANT1, ANT2, ANT3, ANT4 is combined in such a way that the expected signal is revealed.

It should be noted that the performance of the directional emission of these output signals SS1, SS2, SS3, SS4 is highly dependent on the precision of the phase shifts DP1, DP2, DP3, DP4 of these output signals SS1, SS2, SS3, SS4.

Thus, it is necessary, for each transmission path CT1, CT2, CT3, CT4, to detect and optionally adjust the phase shift DP1, DP2, DP3, DP4 of the output signal SS1, SS2, SS3, SS4 so as to ensure the performance of the directional emission.

An example embodiment of one of the transmission paths CT1, CT2, CT3, CT4, here for example the first transmission path CT1, of the router 1, will now be described in more detail with reference to FIG. 2.

The first transmission path CT1 is coupled between the transceiver 2 and the first antenna ANT1 and comprises an input electronic device DEE1 coupled to the transceiver 2, and an output electronic device DES1 coupled to the first antenna ANT1.

By way of nonlimiting example, the first transmission path CT1 furthermore comprises a coupling stage EC1 coupled between the input and output electronic devices DEE1, DES1. For the sake of simplicity, only one example embodiment of the coupling stage EC1 has been illustrated.

Together, the input and output electronic devices DEE1, DES1 and the coupling stage EC1 form a balanced power amplifier.

The input electronic device DEE1 comprises a first hybrid coupler CH1, here for example a 90° quadrature hybrid coupler, comprising a first input terminal BE1 coupled to the transceiver 2 and intended to receive the first analog signal SA1, a so-called "isolated", coupled second input terminal BE2, coupled to an impedance R, for example of 50 ohms, when the coupler is operating in power-divider mode, or a so-called "coupled" second input terminal when the coupler is operating in power-combiner mode, a first output terminal BS1, and a second output terminal BS2.

The electronic input device DDE1 is configured to deliver to the first output terminal BS1, a first intermediate signal SI having a power equal to half the power of the first analog signal SA1, and to the second output terminal BS2, a second intermediate signal SI2 having the same power as the first intermediate signal SI and having a phase shift of 90° with respect to the first intermediate signal SI.

The output electronic device DES1 comprises a second hybrid coupler CH2, here also a 90° quadrature hybrid coupler, operating in power-combiner mode and comprising a third input terminal BE3, a fourth input terminal BE4, a third output terminal BS3, and a fourth output terminal BS4 coupled to the first antenna ANT1 and configured to deliver to the first antenna ANT1 the first output signal SS1.

The third output terminal BS3 is intended to be coupled, when the output electronic device DES1 is in an operating mode, to an impedance, for example of 50 ohms, and receive, when the output electronic device DES1 is in a detecting or adjusting mode, a first test signal ST1.

By way of nonlimiting indication, when the first transmission path CT1 is in use, the first hybrid coupler CH1 operates in power-divider mode and the second hybrid coupler CH2 operates in power-combiner mode.

The coupling stage EC1 comprises a first coupling module MC1 coupled in parallel between the first output terminal BS1 and the third input terminal BE3, and a second coupling module MC2 coupled in parallel between the second output terminal BS2 and the fourth input terminal BE4.

The first coupling module MC1 here for example comprises a first driver stage and a first power controller that are coupled in series between the first output terminal BS1 and the third input terminal BE3.

The first coupling module MC1 is configured to deliver from the first intermediate signal SI1 a third intermediate signal SI3 having an intermediate phase PI.

The second coupling module MC2 comprises a second driver stage and a second power controller that are coupled in series between the second output terminal BS2 and the fourth input terminal BE4.

The second coupling module MC2 is configured to deliver from the second intermediate signal SI2 a fourth intermediate signal SI4 having a phase shift of 90° with respect to the phase of the third intermediate signal SI3.

In order to ensure the phase of the first output signal SS1 delivered to the first antenna ANT1, the first transmission path CT1 is furthermore configured to detect and adjust the phase of the first output signal SS1. It should be noted that this phase of the first output signal SS1 is substantially equal to the phase of the third intermediate signal SI3.

To do this, the output electronic device DES1 furthermore comprises a detecting circuit MD comprising a peak detector DC coupled to the third output terminal BS3 and configured to detect the peak value VC of the first output signal SS1, a generating circuit MG configured to generate the first test signal ST1, a phase shifter DEPH coupled between the fourth output terminal BS4 and the generating circuit MG and configured to modify the test phase of the first test signal ST1, and a processing circuit MT coupled to the peak detector DC and to the phase shifter DEPH, and configured to detect the maximum or minimum peak value of the first output signal SS1 by making the phase of the first test signal ST1 vary so as to detect the phase PI of the third intermediate signal SI3.

An example of an implementation allowing the phase PI of the third intermediate signal SI3, in other words the first output phase PS1 of the first output signal SS1, to be detected and adjusted when the second hybrid coupler CH2 is operating in power-combiner mode will now be described with reference to FIG. 3.

In an initial step STP0, the phase shifter DEPH is configured to inject the test signal ST into the fourth output terminal BS4 without modifying the initial test phase PTI and the peak detector DC is configured to detect an initial peak value Ai.

Steps STP1 to STP4 are iterative steps. In each iteration, a step STP1 in which the phase shifter DEPH is configured to generate a current test phase PTC of the first test signal ST1 by applying a phase shift DEPi to the first test signal ST1 is started with.

It should be noted that the phase shift may for example be, for each iteration, an incrementation or a decrementation of the phase of the first test signal ST1 by a given amount, for example 5°, and that the iterations end when the current test phase reaches a final test phase PTF equal to the initial test phase PTI increased by at least one portion of one complete revolution.

For the sake of simplicity, the final test phase PTF is here for example equal to the initial test phase PTI increased by one complete revolution, i.e. 360°.

The peak detector DC is then configured to measure, in each iteration, the current peak value AC1 of the first output signal SS1 (STP2).

The processing circuit MT is configured to check whether there is a stored maximum peak value Amax higher or a stored minimum peak value Amin lower than the current peak value AC1, respectively.

If this is the case, this current iteration ends and a new iteration will start with a different phase shift DEPi+1.

Otherwise, the processing circuit MT is configured to store in memory the current test phase PTC and the current peak value AC1 as maximum peak value Amax or minimum peak value Amin (STP3).

In other words, if the current peak value AC1 is higher than the stored maximum peak value Amax, this current peak value AC1 is stored in memory as maximum peak value Amax and the current test phase PTC corresponding to this current peak value AC1 is also stored in memory.

If the current peak value AC1 is lower than the stored minimum peak value Amin, this current peak value AC1 is stored in memory as minimum peak value Amin and the current test phase PTC corresponding to this current peak value AC1 is also stored in memory.

In the case of the first iteration after step STP0, as the initial peak value Ai has not been stored in memory, the current peak value AC1 is stored in memory as maximum peak value Amax or minimum peak value Amin and the current test phase PTC corresponding to this current peak value AC1 is also stored in memory.

Once the current test phase PTC reaches the initial test phase PTI (STP4 in FIG. 3), here for example the initial test phase increased by one complete revolution, i.e. 360°, the iterations end and the processing circuit MT is furthermore configured to determine the phase PI of the third intermediate signal SI3, in other words the first output phase PS1 of the first output signal SS1 when the second hybrid coupler CH2 is operating in power-combiner mode, depending on the stored test phase PTM.

Figure 3:
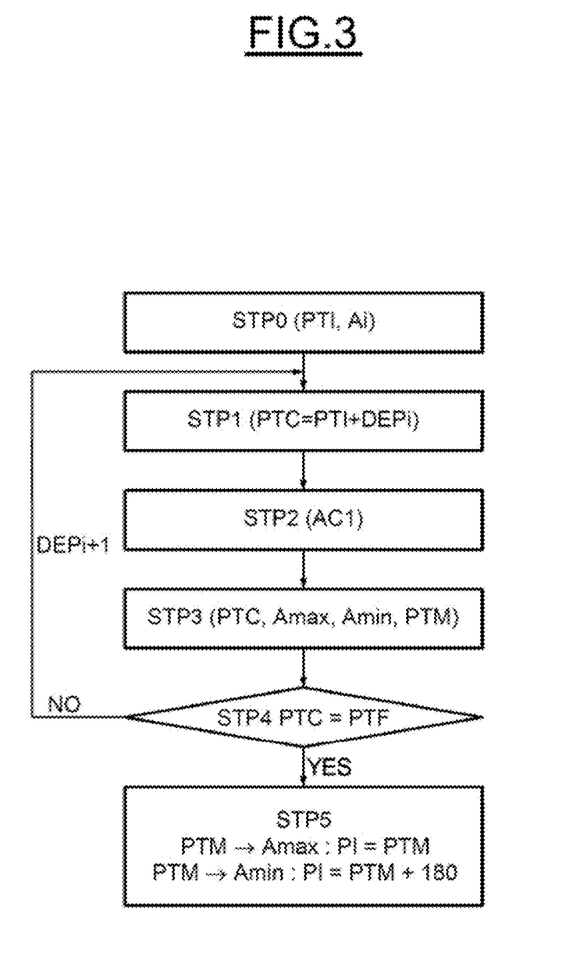
FIG. 3 illustrates a method for adjusting a phase of an analog signal.

The phase PI of the third intermediate signal SI3 is equal to the stored test phase PTM if the stored test phase PTM corresponds to the stored maximum peak value Amax, or to the stored test phase PTM increased by 180° if the stored test phase PTM corresponds to the stored minimum peak value Amin (STP5 in FIG. 3).

It should be noted that the precision of the detection of the intermediate phase PI depends on the size of the variation step in the phase shift DEPi of the first test signal ST1 in each iteration. The smaller the variation step, the higher the precision of the detection.

Figure 4:
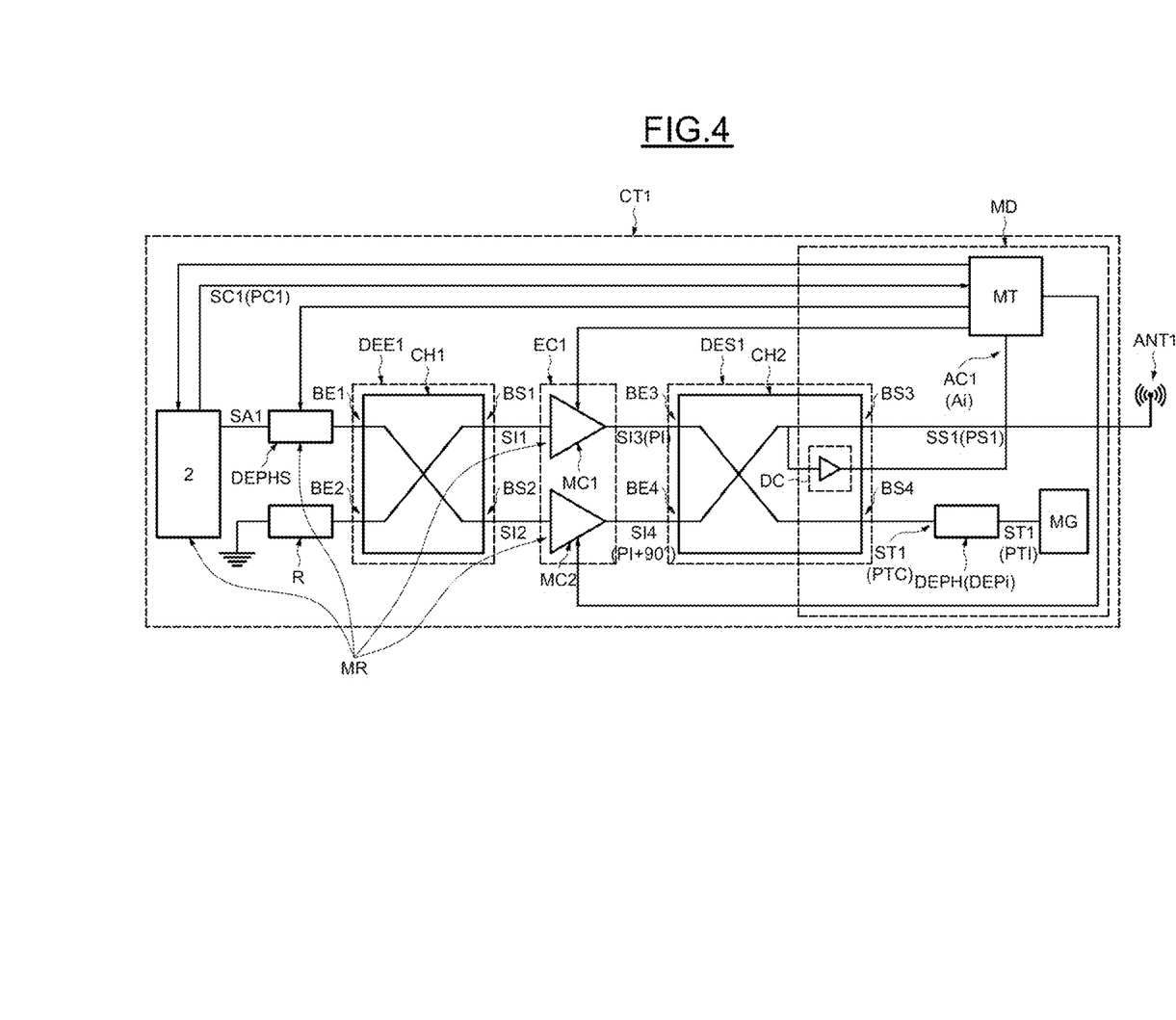
FIG. 4 illustrates another transmission path.

An example embodiment allowing the phase of an analog signal to be adjusted via a hybrid coupler and a corresponding example implementation will now be described with reference to FIG. 4 and FIG. 5, respectively.

Figure 2:
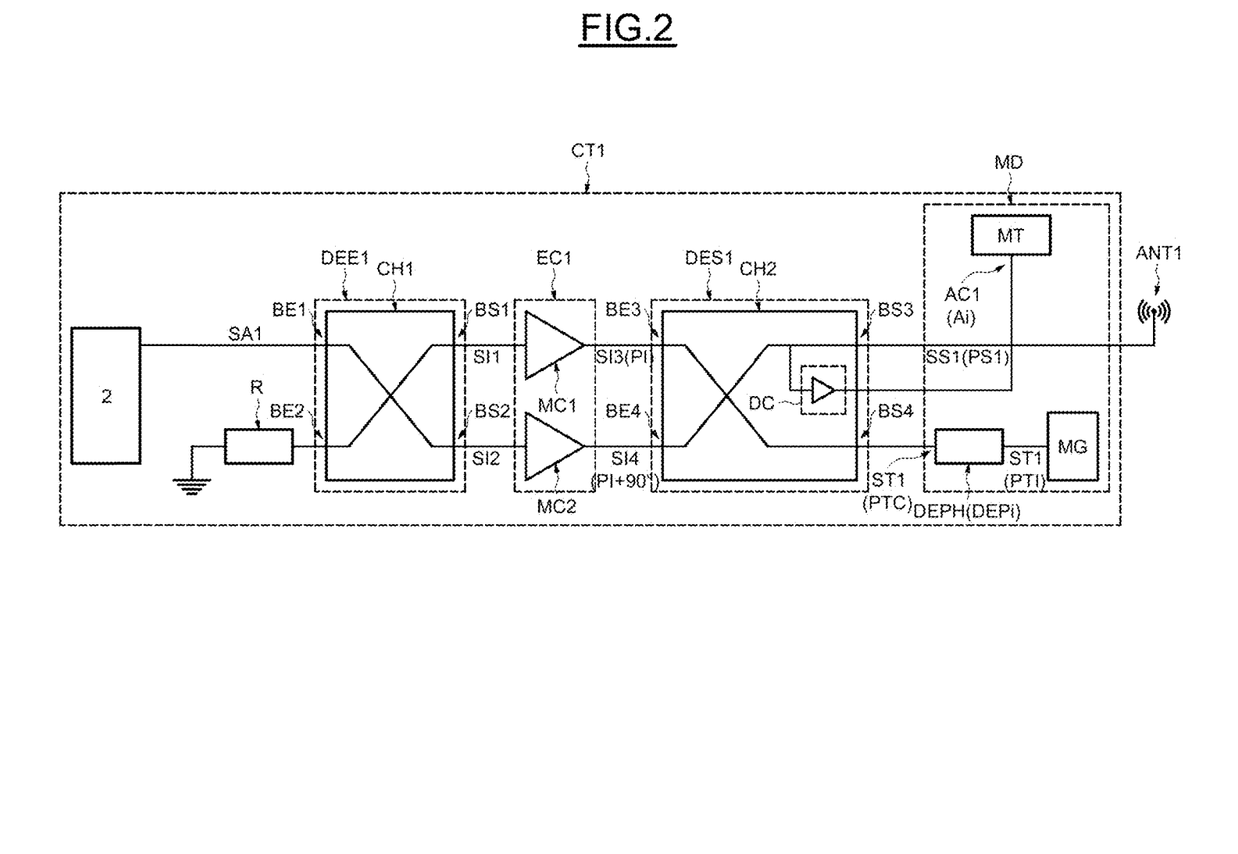
FIG. 2 illustrates a transmission path.

For the sake of simplicity, the transceiver 2, the first transmission path CT1 and the first antenna ANT1 as presented in FIG. 2 are reemployed.

Moreover, the detecting circuit MD is furthermore coupled to the adjusting circuit MR.

The adjusting circuit MR here comprises the transceiver 2 configured to deliver to the processing circuit MT a first setpoint signal SC1 having a first setpoint phase PC1, the first hybrid coupler CH1, and the coupling stage EC1.

As indicated above, to detect and adjust the intermediate phase PI of the third intermediate signal SI3, the coupling stage EC1 is here optional and the adjusting circuit MR may not comprise the coupling stage EC1.

In this case, the first and third intermediate signals SI1, SI3 are the same signals and the second and fourth intermediate signals SI2, SI4 are the same signals.

Indicatively but nonlimitingly, it is possible to have a router comprising a transmission path having an adjusting circuit and another transmission path without an adjusting circuit.

Figure 5:
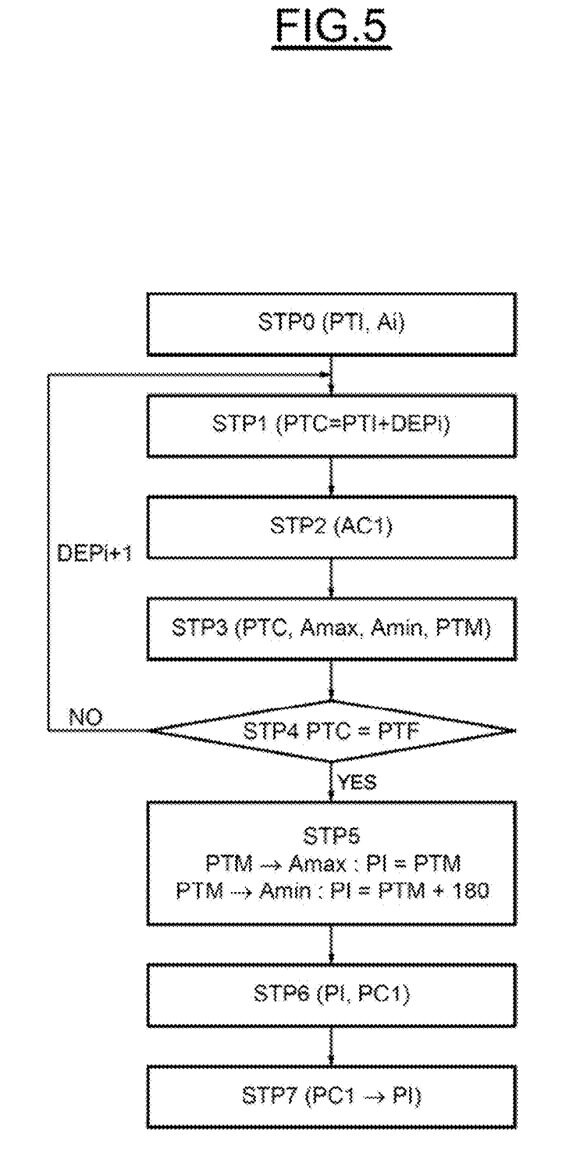
FIG. 5 illustrates another method for adjusting a phase of an analog signal.

For the sake of simplicity, only one example embodiment of the invention comprising an adjusting circuit MR with the coupling stage EC1 has been illustrated in FIG. 5.

Once the phase PI of the third intermediate signal SI has been determined in steps STP0 to STP5, the processing circuit MT is furthermore configured to compare the intermediate phase PI with the first setpoint phase PC1 (STP6 in FIG. 5).

When the intermediate phase PI and the first setpoint phase PC1 are different, the transceiver 2 is furthermore configured to adjust under control by the processing circuit MT the intermediate phase PI of the third intermediate signal via an adjustment of the phase of the first analog signal SA1 until an equality is obtained between the first setpoint phase PC1 and the intermediate phase PI to within a tolerance (STP7 in FIG. 5).

Indicatively but nonlimitingly, the tolerance may for example here be about 5%.

According to one variant, the adjusting circuit MR may furthermore comprise an additional phase shifter DEPHS coupled between the transceiver 2 and the first hybrid coupler CH1 and configured to adjust under control by the processing circuit MT the phase PI of the third intermediate signal via an adjustment of the phase of the first analog signal SA1 until an equality is obtained between the first setpoint phase PC1 and the phase PI to within a tolerance (STP7 in FIG. 5).

It should be noted that the adjustment of the phase PI may be carried out only by the additional phase shifter DEPHS or in combination with the transceiver 2.

According to another variant, the adjusting circuit MR may furthermore comprise the first and second coupling modules MC1, MC2.

The first coupling module MC1 is configured to adjust under control by the processing circuit MT the phase PI of the third intermediate signal SI3 until an equality is obtained between the first setpoint phase PC1 and the intermediate phase PI to within a tolerance (STP7 in FIG. 5).

The second coupling module MC1 is configured to adjust under control by the processing circuit MT the phase of the fourth intermediate signal SI4 until an equality is obtained between the first setpoint phase PC1 that is phase shifted by 90° and the phase of the fourth intermediate signal SI4 to within a tolerance (STP7 in FIG. 5).

It should also be noted that the phase PI may be adjusted by the third coupling module MC3 alone or in combination with the additional phase shifter DEPHS and/or the transceiver 2.

Thus, a technical solution of low complexity for detecting and adjusting the phase of an analog signal using a hybrid coupler is obtained, this solution being particularly suitable for electromagnetic applications in the radio-frequency (RF) domain and in particular in the millimeter-band domain.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A method of operating a hybrid coupler in a power-combiner mode, the method comprising:
   receiving, at a first input of the hybrid coupler, a first analog signal;
   receiving, at a second input of the hybrid coupler, an additional analog signal that is phase shifted by 90° with respect to the first analog signal;
   injecting, into a second output of the hybrid coupler, a test signal having an initial test phase;
   iteratively generating a current test phase for the test signal, from the initial test phase to a final test phase equal to the initial test phase increased by at least one portion of one complete revolution, and, in each iteration:
      measuring a current peak value of an output signal from a first output of the hybrid coupler; and
      storing in memory the current test phase and the current peak value as a maximum peak value or a minimum peak value in response to there not being a stored maximum peak value higher or a stored minimum peak value lower than the current peak value, respectively; and
   determining a phase of the first analog signal from the stored test phase.

2. The method as claimed in claim 1, wherein the phase of the first analog signal is equal to:
   the stored test phase, in response to the stored test phase corresponding to the stored maximum peak value; or
   the stored test phase increased by 180°, in response to the stored test phase corresponding to the stored minimum peak value.

3. The method as claimed in claim 1, wherein the final test phase is the initial test phase increased by one complete revolution.

4. The method as claimed in claim 1, further comprising:
   comparing a setpoint phase and the phase of the first analog signal; and
   in response to the setpoint phase and the determined phase of the first analog signal being different, adjusting the phase of the first analog signal until the setpoint phase and the phase of the first analog signal are equal to within a tolerance.

5. The method as claimed in claim 4, wherein the tolerance is 5 to 10%.

6. The method as claimed in claim 4, wherein the tolerance is 5%.

7. An electronic device, comprising:

a hybrid coupler configured to operate in a power-combiner mode, the hybrid coupler comprising:
  a first input configured to receive a first analog signal;
  a second input configured to receive an additional analog signal that is phase shifted by 90° with respect to the first analog signal;
  a first output configured to provide an output signal; and
  a second output;
a detecting circuit configured to:
  inject, into the second output, a test signal having an initial test phase;
  iteratively generate a current test phase for the test signal, from the initial test phase to a final test phase equal to the initial test phase increased by at least one portion of one complete revolution, and, in each iteration:
    measure a current peak value of the output signal; and
    store in memory the current test phase and the current peak value as a maximum peak value or a minimum peak value in response to there not being a stored maximum peak value higher or a stored minimum peak value lower than the current peak value, respectively; and
  determine a phase of the first analog signal from the stored test phase.

8. The electronic device as claimed in claim 7, wherein the phase of the first analog signal is equal to:
  the stored test phase in response to the stored test phase corresponding to the stored maximum peak value; or
  the stored test phase increased by 180° in response to the stored test phase corresponding to the stored minimum peak value.

9. The electronic device as claimed in claim 7, wherein the final test phase is the initial test phase increased by one complete revolution.

10. The electronic device as claimed in claim 7, further comprising:
  an adjusting circuit coupled to the hybrid coupler, and configured to:
    deliver to the first input the first analog signal;
    deliver to the second input the additional analog signal; and
    deliver to the detecting circuit a setpoint signal having a setpoint phase;
  wherein the detecting circuit is further configured to:
    compare the setpoint phase and the determined phase of the first analog signal; and
    in response to the setpoint phase and the determined phase of the first analog signal being different, adjust the phase of the first analog signal via the adjusting circuit until the setpoint phase and the determined phase of the first analog signal are equal to within a tolerance.

11. The electronic device as claimed in claim 10, wherein the adjusting circuit comprises a complementary hybrid coupler configured to operate in a power-divider mode and coupled to the first and second inputs of the hybrid coupler.

12. The electronic device as claimed in claim 10, wherein the adjusting circuit comprises a complementary hybrid coupler configured to operate in a power-divider mode and coupled to the first and second inputs of the hybrid coupler via a coupling stage.

13. The electronic device as claimed in claim 10, wherein the tolerance is 5 to 10%.

14. The electronic device as claimed in claim 10, wherein the tolerance is 5%.

15. An apparatus, comprising:
an electronic device comprising:
  a hybrid coupler configured to operate in a power-combiner mode, the hybrid coupler comprising:
    a first input configured to receive a first analog signal;
    a second input configured to receive an additional analog signal that is phase shifted by 90° with respect to the first analog signal;
    a first output configured to provide an output signal; and
    a second output;
  a detecting circuit configured to:
    inject, into the second output, a test signal having an initial test phase;
    iteratively generate a current test phase for the test signal, from the initial test phase to a final test phase equal to the initial test phase increased by at least one portion of one complete revolution, and, in each iteration:
      measure a current peak value of the output signal; and
      store in memory the current test phase and the current peak value as a maximum peak value or a minimum peak value in response to there not being a stored maximum peak value higher or a stored minimum peak value lower than the current peak value, respectively; and
    determine a phase of the first analog signal from the stored test phase; and
  an antenna coupled to the hybrid coupler.

16. The apparatus as claimed in claim 15, wherein the apparatus is a communication apparatus.

17. The apparatus as claimed in claim 15, wherein the phase of the first analog signal is equal to:
  the stored test phase in response to the stored test phase corresponding to the stored maximum peak value; or
  the stored test phase increased by 180° in response to the stored test phase corresponding to the stored minimum peak value.

18. The apparatus as claimed in claim 15, wherein the final test phase is the initial test phase increased by one complete revolution.

19. The apparatus as claimed in claim 15, wherein the electronic device further comprises:
  an adjusting circuit coupled to the hybrid coupler, and configured to:
    deliver to the first input the first analog signal;
    deliver to the second input the additional analog signal; and
    deliver to the detecting circuit a setpoint signal having a setpoint phase;
  wherein the detecting circuit is further configured to:
    compare the setpoint phase and the determined phase of the first analog signal; and
    in response to the setpoint phase and the determined phase of the first analog signal being different, adjust the phase of the first analog signal via the adjusting circuit until the setpoint phase and the determined phase of the first analog signal are equal to within a tolerance.

20. The apparatus as claimed in claim 19, wherein the adjusting circuit comprises a complementary hybrid coupler configured to operate in a power-divider mode and coupled to the first and second inputs of the hybrid coupler.

21. The apparatus as claimed in claim 19, wherein the adjusting circuit comprises a complementary hybrid coupler configured to operate in a power-divider mode and coupled to the first and second inputs of the hybrid coupler via a coupling stage.

22. The apparatus as claimed in claim 19, wherein the tolerance is 5 to 10%.

\* \* \* \* \*